(12) United States Patent
Huang

(10) Patent No.: US 12,040,129 B2
(45) Date of Patent: Jul. 16, 2024

(54) ENERGY CONVERSION DEVICE WITH A CRYOGENIC COIL

(71) Applicant: SHANGHAI JIAO TONG UNIVERSITY, Shanghai (CN)

(72) Inventor: Zhen Huang, Shanghai (CN)

(73) Assignee: SHANGHAI JIAO TONG UNIVERSITY, Shanghai (CN)

( * ) Notice: Subject to any disclaimer, the term of this patent is extended or adjusted under 35 U.S.C. 154(b) by 306 days.

(21) Appl. No.: 17/371,084

(22) Filed: Jul. 8, 2021

(65) Prior Publication Data
US 2022/0059267 A1    Feb. 24, 2022

Related U.S. Application Data

(63) Continuation of application No. PCT/CN2020/071412, filed on Jan. 10, 2020.

(30) Foreign Application Priority Data

Jan. 10, 2019 (CN) .......................... 201910023177.6
Mar. 5, 2019 (CN) .......................... 201910163732.5

(51) Int. Cl.
*H01F 6/06* (2006.01)
*H01F 6/04* (2006.01)
(Continued)

(52) U.S. Cl.
CPC ................ *H01F 6/06* (2013.01); *H01F 6/04* (2013.01); *H02M 5/4585* (2013.01); *H02M 7/003* (2013.01)

(58) Field of Classification Search
CPC .......... H01F 6/04; H01F 6/06; H02M 5/4585; H02M 7/003
(Continued)

(56) References Cited

U.S. PATENT DOCUMENTS 5,016,600 A * 5/1991 Hilal .......................... F41B 6/00
336/DIG. 1
9,240,681 B2 * 1/2016 Rajput-Ghoshal ..... H02H 7/001
(Continued)

FOREIGN PATENT DOCUMENTS

CN    1757122 A    4/2006
CN    1874131 A    12/2006
(Continued)

OTHER PUBLICATIONS

International Search Report of PCT/CN2020/071412.
(Continued)

*Primary Examiner* — Yemane Mehari

(57) ABSTRACT

The invention discloses an energy conversion device with a cryogenic coil, which relates to the technical field of electromagnet excitation, the device comprises a cold source module, a vacuum module, an external energy module, an internal energy module and a connection module; the cold source module is configured to provide the cold source to the vacuum module, the external energy module is configured to be located outside the vacuum module, the internal energy module is configured to be located inside the vacuum module, and the internal energy module and the external energy module are configured to be connected through the connection module. The energy conversion device with a cryogenic coil further comprises a coolant module, the coolant module is configured to be located inside the vacuum module, and the internal energy module is configured to be located inside the coolant module. The connection module comprises a power electronic converter.

18 Claims, 14 Drawing Sheets

(51) Int. Cl.
*H02M 5/458* (2006.01)
*H02M 7/00* (2006.01)

(58) Field of Classification Search
USPC .......................................................... 363/37
See application file for complete search history.

(56) References Cited

U.S. PATENT DOCUMENTS

2016/0189842 A1* 6/2016 Jonas ........................ H01F 6/04
                                                            335/216
2018/0287407 A1* 10/2018 Sayre ........................ H01F 6/00

FOREIGN PATENT DOCUMENTS

| CN | 104094367 | A | 10/2014 |
| CN | 105655084 | A | 6/2016 |
| CN | 106663514 | A | 5/2017 |
| CN | 107110934 | A | 8/2017 |
| CN | 107645212 | A | 1/2018 |

OTHER PUBLICATIONS

Written Opinion of PCT/CN2020/071412.
International Search Report of PCT/CN2019/102301.
Written Opinion of PCT/CN2019/102301.

* cited by examiner

ENERGY CONVERSION DEVICE WITH A CRYOGENIC COIL

CROSS-REFERENCE TO RELATED APPLICATIONS

This application is a bypass continuation application of PCT application no.: PCT/CN2020/071412. This application claims priorities from PCT Application No. PCT/CN2020/071412, filed Jan. 10, 2020, PCT Application No. PCT/CN2019/102301, filed Aug. 23, 2019, Chinese patent application 201910023177.6, filed Jan. 10, 2019, and from the Chinese patent application 201910163732.5 filed Mar. 5, 2019, the contents of which are incorporated herein in the entirety by reference.

TECHNICAL FIELD

The present invention relates to the field of electromagnet excitation technology, in particular to an energy conversion device with a cryogenic coil.

BACKGROUND

The phenomenon of superconductivity was discovered in 1911, and due to its excellent properties, such as zero resistance, it quickly attracted the attention of researchers worldwide. The critical temperature of superconducting materials can reach 20K-77 K or even higher, and some materials can enter the superconducting state in a liquid nitrogen environment. At present, some superconducting materials have been industrialized and mass-produced (such as NbTi, $Ni_3Sn$, $MgB_2$, REBCO, etc.). Superconducting coils made of superconducting materials can be produced under DC excitation due to their zero resistance characteristics. The magnetic induction intensity of the coil made of traditional copper wire cannot be reached, and in some occasions, it can be much lighter than the coil made of traditional copper wire with the same magnetic induction intensity, and the loss is smaller, so it has a wide range of application prospects of magnetic resonance imaging, nuclear magnetic resonance spectrometer, electric motor, magnetic levitation, and other applications. At the same time, for example, the "super copper wire" technology developed by the Oak Ridge National Laboratory is to attach a carbon nanotube material to the copper material, which is similar to graphene. Its electrical conductivity is 10 times that of copper, its current capacity is 100 times that of copper, its thermal conductivity is 10 times that of copper, its strength is 300 times that of copper, and its weight is only ¼-⅙ of copper. This "super copper wire" is also a potential cryogenic coil material to generate a strong magnetic field. However, there is currently no good-enough technical solution for excitation of cryogenic coils and energy feedback with low heat leakage, simple but high efficiency, and high-power density.

Three prior art technologies were found in the search, described as following:

[Prior Art 1] Cryogenic Coil Open-Loop Excitation Technology

As shown in FIG. 1, the traditional cryogenic coil excitation uses a current lead to directly excite an open-loop cryogenic coil. At this time, because the cryogenic coil works at extremely low temperatures (generally 4.2K-77K), there will be a large temperature gradient from high temperature to low temperature in the current lead, which will cause large conduction of heat leakage; at the same time, due to the operating current of the cryogenic coil is relatively high (generally hundreds of amperes or even thousands of amperes) will generate greater Joule heat. This kind of excitation technology has high robustness, but requires high cooling capacity, which is limited in many applications where cooling capacity is limited or the system needs to be lightweight.

[Prior Art 2] Superconducting Coil Closed-Loop Excitation Technology

In order to overcome the shortcomings of the traditional superconducting coil in open-loop excitation technology, using the zero-resistance characteristics of superconducting coils, the superconducting coils are excited to form a closed loop and the current leads are disconnected/unplugged in the vacuum module (as shown in FIG. 2). In this technology, the heat leakage of the current lead when the superconducting coil excited is still relatively large; but after the superconducting coil is closed when the excitation is completed, the heat leakage is almost zero, and the heat leakage is only the radiation heat exchange at the hot and cold ends of the current lead. The disadvantage of this excitation technology is that, compared with the prior art 1, the system is more complicated, and the ultra-low resistance or superconducting joint is more difficult to make. The joint resistance is as small as possible for the closed coil to ensure the long operation of the closed coil. It runs almost without time decay; secondly, in order to make the resistance of the superconducting coil almost zero, the current that the closed coil can pass is relatively lower than that of the open-loop coil under the same conditions (when the current in the superconducting coil is close to the critical current, the resistance will be slowly bring forth; the open loop coil does not need to worry too much about the small resistance); finally the closed coil needs to be controlled before and after the excitation of the open loop and closed loop (the closed superconducting coil needs to be locally quenched during excitation, and the excitation method is the same as the above prior art 1. After the excitation is completed, the quench part needs to be restored to the superconducting state, and then the current lead is disconnected to form a closed loop). Such open-closed loop operation will introduce additional control difficulty and uncertain factors, and the robustness of the system is lower than that of open-loop excitation technology.

[Prior Art 3] Superconducting Coil Closed-Loop Excitation Technology

In order to overcome the problem of the superconducting coil closed-loop excitation technology (the above-mentioned prior art 2) that there is a current lead during excitation, the heat leakage is large, a superconducting coil closed-loop excitation technology (this prior art) is available, as shown in FIG. 3. This technical solution uses the magnetic flux pump technology to directly excite the closed coil, and the overall heat generation can be very small, but other shortcomings caused by the closed coil still exist (refer to the prior art 2) and will cause the internal structure of the coil compared with the prior art 2 described above, it is relatively complicated. Flux pump technology is to pump energy alternately into superconducting closed coils. Among them, the magnetic flux pump that does not interrupt the superconducting characteristic, usually produces a lower excitation voltage at both ends of the coil, which is a better magnetic compensation technology, but this precisely restricts the application of high-inductance cryogenic coils that require fast charging; such as using it to generate a relatively large excitation voltage, increase the excitation speed, the loss will increase, the thermal load of the system will increase, and the excitation efficiency will be affected. Some magnetic flux pumps contain iron cores as their components, so when the power is high and the frequency is low, the weight is relatively larger and the volume is relatively larger. Some types of magnetic flux pumps cannot achieve energy feedback.

Therefore, those skilled in the art devote themselves to developing an energy conversion device with cryogenic coils, which has high power and low power consumption, and at the same time solves most of the defects of the above-mentioned prior arts, such as large lead leakage, complex system, and difficult control, heavy weight, large volume and not easy to charge and discharge quickly, etc.

INVENTION SUMMARY

In view of the above-mentioned shortcomings of the prior arts, the technical problems to be solved by the present invention include:

(1) It solves the problems of the existing cryogenic coil open-loop excitation technology (Prior Art 1) that the current lead generates a large amount of heat, which leads to a large cooling capacity and the cryogenic coil system is too bulky. Open-loop operation can avoid the dependence on the difficult manufacturing process of ultra-low resistance or superconducting joints during closed-loop operation; it solves the low utilization of superconducting materials (the closed-loop operating current of superconducting coils is relatively low compared to open-loop under the same conditions); For closed coils winding by high-temperature superconducting materials (such as REBCO, etc.), it is not easy to quickly release energy and so on.

(2) It solves the problem that the excitation system existing in the superconducting coil closed-loop excitation technology (Prior Art 2) is relatively complicated; during excitation, the current lead generates a large amount of heat, and the traditional pluggable current lead has interface contact heat at the connection. The thermal power caused by the resistance is relatively large.

(3) It solves the problem of the flux pump technology that does not interrupt the superconducting characteristics existing in the superconducting coil closed-loop excitation technology (Prior Art 3). Due to the low voltage generated at both ends of the coil, The discharge is slow when it is used for high-inductance cryogenic coils; if a magnetic flux pump is used to generate a relatively large terminal voltage, the loss will also increase, and the thermal load of the system will increase, which will affect the excitation/demagnetization efficiency; and low utilization of superconducting materials.

(4) It solves the problem that some magnetic flux pumps existing in the superconducting coil closed-loop excitation technology (Prior Art 3) contain iron cores as their components. When the power is high and the frequency is low, the weight is relatively high and the volume is relatively large; some types of magnetic flux pumps cannot achieve energy feedback.

In order to achieve the above objective, the present invention provides an energy conversion device with a cryogenic coil, comprises a cold source module, a vacuum module, an external energy module, an internal energy module, and a connection module; the cold source module is configured to provide a cold source to the vacuum module, the external energy module is configured to be located outside the vacuum module, the internal energy module is configured to be located inside the vacuum module, and the internal energy module and the external energy module are configured to be connected through the connection module.

Further the energy conversion device with a cryogenic coil further comprises a coolant module, the coolant module is configured to be located inside the vacuum module, and the internal energy module is configured to be located inside the coolant module.

Further the connection module comprises a power electronic converter, and the power electronic converter comprises a large-current unit and a small-current unit, and the large-current unit is connected to the internal energy module through a large-current current lead.

Further the large-current unit is configured inside the vacuum module.

Further the large-current unit is configured inside the coolant module.

Further the internal energy module is a cryogenic coil and/or a superconducting coil.

Further the current lead connecting the large-current unit and the internal energy module is disconnectable.

Further the current lead and/or signal wire connecting the small-current unit and the large-current unit are disconnectable, and/or the current lead connecting the external energy module and the large-current unit is disconnectable.

Further the power electronic converter is a DC-DC converter or an AC-DC converter, and the DC-DC converter is single or multiple in a parallel topology, the AC-DC converter is a half-wave fully-controlled rectifier circuit or a full-wave fully-controlled rectifier circuit or a single-phase half-bridge fully-controlled rectifier circuit or a single-phase full-bridge fully-controlled rectifier circuit.

Further the AC-DC converter is configured with a tightly coupled transformer or a loosely coupled transformer.

Further the input end of the tightly coupled transformer or the loosely coupled transformer is an inverter or an AC power source.

Further when the primary and secondary sides of the loosely coupled transformer are separated by a container wall, the part of the container wall is made of non-metallic materials and/or non-ferromagnetic materials.

Further the fully controlled power semiconductor device is replaced with diode and/or semi-controlled power semiconductor devices in the half-wave full-controlled rectification circuit or full-wave full-controlled rectification circuit or single-phase half-bridge full-controlled rectification circuit or single-phase full-bridge full-controlled rectification circuit.

Further the multiple parallel structures of the DC-DC converters are interleaved parallel structures.

Further the DC-DC converter comprises a half-bridge circuit or a full-bridge circuit, and the half-bridge arm or the full-bridge arm is configured as single or multiple fully-controlled power semiconductor devices in parallel.

Further the large-current unit and the small-current unit are configured to be connected by at least one pair of twisted pairs.

Further the large-current current lead is single wire or multiple wires made of superconducting materials.

Further the superconducting material is a multi-layer stack or a multi-stranded wire or a superconducting composite cable.

Further the layers of the multi-layer stack structure are configured to be connected and reinforced by soldering.

Further the larger current lead is a single wire or multiple wires made of good conductor materials or superconducting materials and/or their combinations.

Further the power electronic converter comprises one or combination of Buck circuit, bidirectional Buck-Boost circuit, half-bridge circuit, bridge DC conversion circuit.

Further the power electronic converter comprises a bridge-type DC conversion circuit, and further comprises a secondary side part of the bidirectional forward converter except for the winding of the transformer.

Further the fully-controlled power semiconductor device portion of the Buck circuit or the bidirectional Buck-Boost circuit or the half-bridge circuit or the bridge DC conversion circuit is configured inside the vacuum module.

Further the fully-controlled power semiconductor device portion of the Buck circuit or the bidirectional Buck-Boost circuit or the half-bridge circuit or the bridge DC conversion circuit is configured inside the coolant module.

Further the small-current unit comprises a digital controller and/or a driving circuit of a fully-controlled power semiconductor device, and the small-current unit is configured to be located outside of the vacuum module.

Further the small-current unit comprises a digital controller and/or a driving circuit of a fully-controlled power semiconductor device, and the small-current unit is configured to be located inside of the vacuum module, the small-current unit is configured to be at a higher temperature than the large-current unit, cooling by the cold source module or the coolant module or the dewar wall or cold helium gas pipe or cold shield or cryogenic coil.

Further the smaller current unit comprises a digital controller and/or a drive circuit of a fully-controlled power semiconductor device, the smaller current unit is configured to be located inside the coolant module or the vacuum module, at a temperature similar to or at the same temperature as the cryogenic coil or heat sink.

Further the external energy module comprises an energy storage element and/or a rectifier and/or an isolation transformer, and the energy storage element comprises one or combination of power supply, battery, capacitor, inductor.

Further the internal energy module is configured for open-loop operation or closed-loop operation.

Further a cryogenic inductor is connected in series at the closure of the superconducting coil, and/or in series at the current lead between the internal energy module and the large-current unit.

Further the cooling method of the large-current unit is from one or combination of cold source module, coolant container wall, coolant, cold helium gas pipe, cold shield, and cryogenic coil.

Further the power electronic converter comprises fully-controlled power semiconductor device.

Further the fully-controlled power semiconductor device is one or combination of MOSFET, IGBT, and wide bandgap semiconductor.

Further the power electronic converter is configured to output direct current and interact with an external alternating magnetic field provided by an electromagnet with an iron core, generating dynamic resistance at the closed part of the superconducting coil for magnetic-controlled excitation.

Further the coolant module is one or combination of liquid nitrogen, fixed nitrogen, liquid neon, solid neon, liquid hydrogen, liquid helium, cold helium, liquid oxygen, liquefied natural gas.

Compared with the prior art, the advantages and beneficial effects that this invention can bring with mainly include:

(1) Compared with the prior art 1 cryogenic coil open-loop excitation technology, if the cryogenic coil operates in an open loop, the heat generated on the current lead during excitation of the present invention is greatly reduced, so the required power of cooling is reduced, and the overall weight of the cryogenic coil system is reduced. The present invention solves the problem of large heat leakage on the current lead, so that the original superconducting coil can only be operated in closed loop, and open loop operation can be selected. The open loop operation can allow coils winding by high temperature superconducting materials (such as REBCO, etc.) Easier to quickly release energy. At the same time, compared with the prior art 2 and prior art 3 superconducting coil closed-loop excitation technology, the dependence on ultra-low resistance or superconducting joints is avoided. The open-loop operation of the superconducting coil can obtain a higher operating current than the closed-loop operation, which means that the superconducting coil needs less superconducting material to produce the same magnetic induction intensity under the same circumstances, which reduces the material cost of the coil system or in the same amount of superconducting material, increase the operating temperature, so that the superconducting coil system can obtain more cooling power.

(2) Compared with the prior art 1, cryogenic coil open-loop excitation technology and prior art 2 superconducting coil closed-loop excitation technology, the present invention has low heating power on the current lead when the coil is excited. The current lead with the power electronic converter can avoid or reduce the thermal power generated by the interface contact thermal resistance at the connection, so that the superconducting coil can obtain a lower temperature under the same excitation condition, thereby obtaining a larger current safety margin or higher excitation current.

(3) Compared with the prior art 2 superconducting coil closed loop excitation technology, if the superconducting coil operates in a closed loop, the present invention can reduce the total heat generation on the current lead when the thermal control superconducting persistent current switch is excited. The superconducting persistent current switch can be changed from a thermal control switch to a current control switch, which greatly simplifies the internal structure of the closed coil and eliminates some external supporting equipment (such as temperature controllers, etc.). Or it can be used with thermal control and current control switch to reduce the risk of heat island formation at the switch.

(4) Compared with the prior art 3 superconducting coil closed-loop excitation technology, the power electronic converter in the present invention can output direct current and interact with the external alternating magnetic field provided by an electromagnet with an iron core to generate dynamic resistance at the closed coil. Magnetically controlled excitation (flux pump) is lighter in weight, faster in energy pumping, and simpler in control than low-frequency rectifier-type magnetic flux pumps.

(5) Compared with the prior art 3 superconducting coil closed-loop excitation technology, the power electronic converter of the present invention can achieve faster excitation speed and/or more convenient energy feedback to the superconducting coil.

(6) Compared with the prior art 2 and 3, the present invention can be used for open-loop operation of cryogenic coils. In this case, it is not limited to superconducting coils, but is also applicable to other good-conductor cryogenic coils.

In the following, the concept, specific structure, and technical effects of the present invention will be further described with reference to the accompanying drawings, so as to fully understand the purpose, features and effects of the present invention.

DETAILED DESCRIPTION

Figure 1:
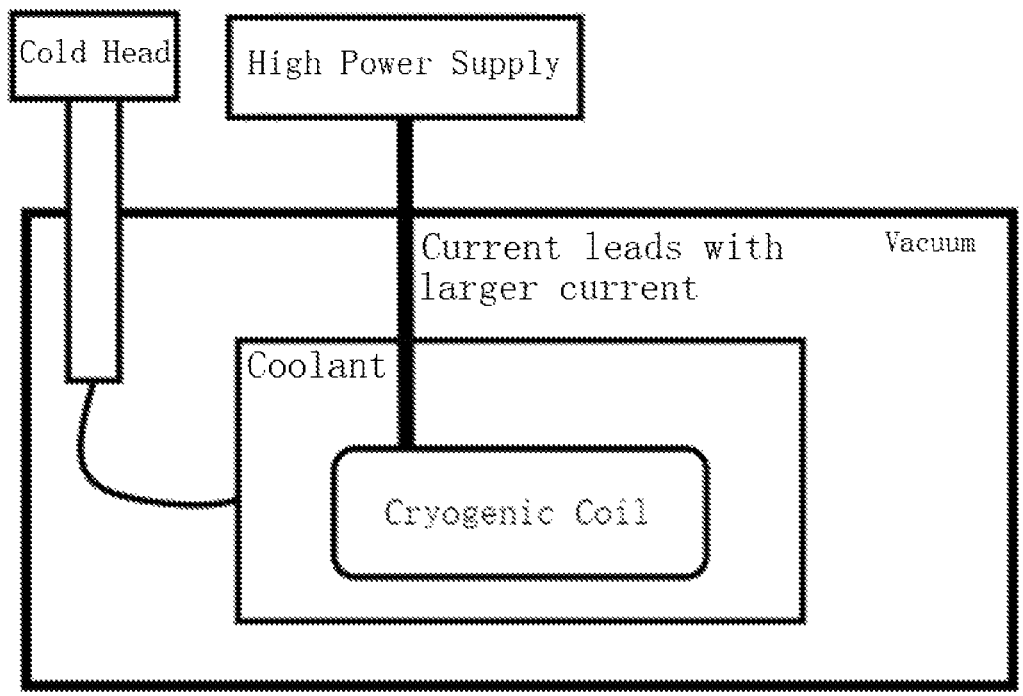
FIG. 1 is a schematic diagram of the connection of the cryogenic coil open-loop excitation structure described in prior art 1.
Figure 2:
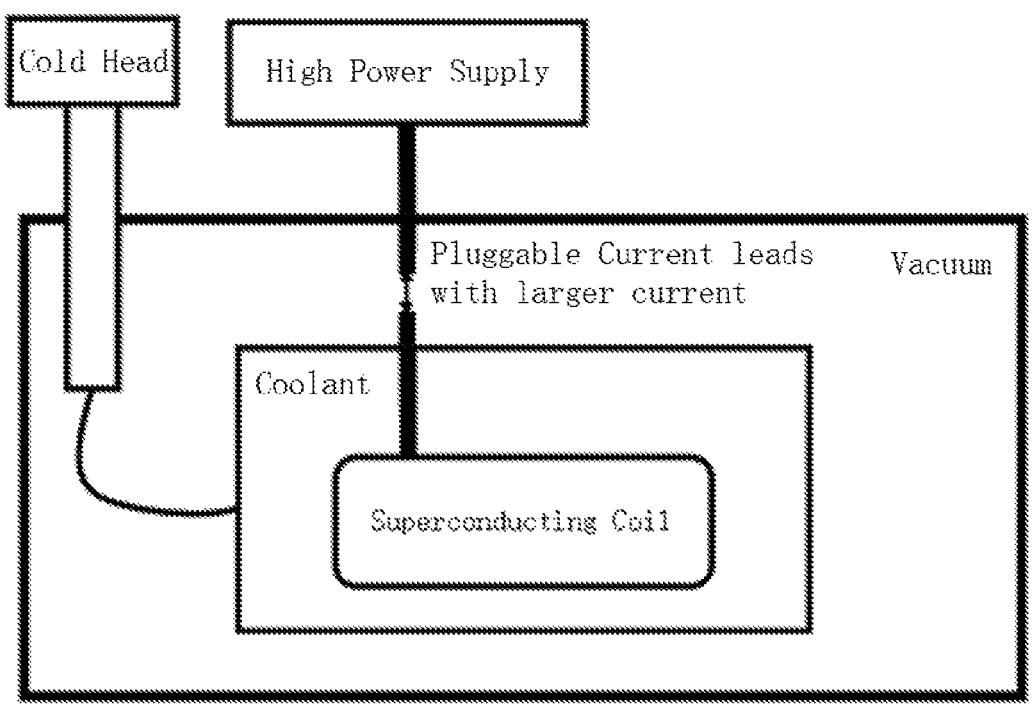
FIG. 2 is a schematic diagram of the connection of the superconducting coil closed-loop excitation structure described in prior art 2.
Figure 3:
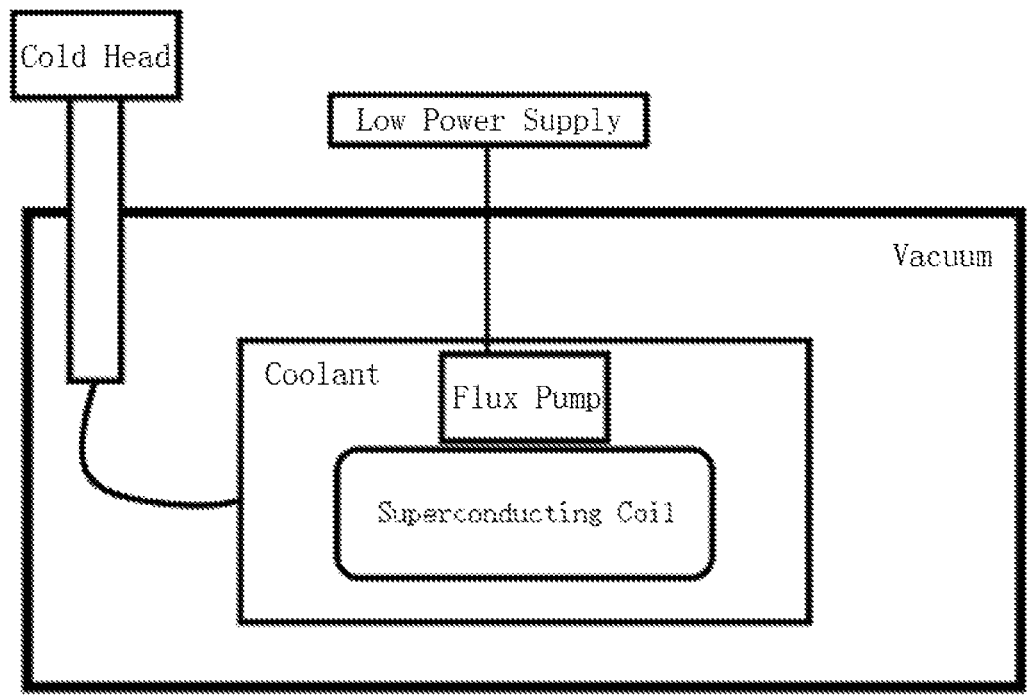
FIG. 3 is a schematic diagram of the connection of the superconducting coil closed-loop excitation structure described in prior art 3.

Hereinafter, several preferred embodiments of the present invention will be introduced with reference to the drawings in the specification, so that the technical content will be clearer and easier to understand. The present invention can be embodied by many different forms of embodiments, and the protection scope of the present invention is not limited to the embodiments mentioned in the text.

In the drawings, components with the same structure are represented by the same numerals, and components with similar structures or functions are represented by similar numerals or text numerals. The size and thickness of each component shown in the drawings are arbitrarily shown, and the present invention does not limit the size and thickness of each component. In order to make the illustration clearer, the thickness of the components is appropriately exaggerated in some places in the drawings.

The related concepts described in this application document are defined as follows:

Cryogenic coil: A coil made of good conductor material or superconducting material is in a low temperature environment.

Zero resistance characteristics: Superconducting materials in a superconducting state have zero resistance when there is no changing current or magnetic field.

Superconducting material: Under certain conditions, a material with zero resistance.

Critical temperature: When the temperature of the superconducting material drops below a certain temperature, the superconducting material exhibits zero resistance characteristics. This temperature is called the critical temperature of the superconducting material.

Critical magnetic field: When the external magnetic induction intensity of the superconducting material is below a certain value, the superconducting material exhibits zero resistance characteristics. This magnetic field is called the critical magnetic field of the superconducting material.

Critical current: When the DC excitation current in the superconducting material is below a certain value, the superconducting material exhibits zero resistance characteristics. This current is called the critical current of superconducting materials.

Quench: The superconducting material changes from a superconducting state to a non-superconducting state. The reason may be that the temperature is higher than the critical temperature, the magnetic field is higher than the critical magnetic field, or the current is higher than the critical current.

Superconducting coil: A coil made of superconducting material, similar to a copper coil, but the internal resistance of the coil is very small or close to zero.

Solid Nitrogen: Solid nitrogen is derived from nitrogen in the air and is inexpensive. It is used as a coolant to keep the operating temperature of the superconducting coil below the critical temperature. Nitrogen gas undergoes a gas-liquid phase transition at approximately 77K, a liquid-solid phase transition at approximately 63K, and a solid-solid phase transition at approximately 35.6K.

Current lead: a lead used for excitation or energy feedback to the cryogenic coil. One end of the current lead is usually in a low temperature environment and the other end is at room temperature. The large temperature gradient at both ends will cause large conduction leakage heat. In addition, although the cryogenic coil has a small resistance, it generally has a large excitation current. Large joule heat will be generated at the excitation at the same time. In general, the low temperature system will cause relatively serious heat leakage due to the use of current leads, which will greatly increase the load of the cooling system.

Flux pump technology: an excitation technology that alternately pumps energy into the superconducting closed coil.

Dynamic resistance: the resistance generated by the interaction between the direct current and the applied alternating magnetic field in the superconducting wire. The external alternating magnetic field is usually generated by an inductor with an iron core.

First Set of Embodiments

The invention designs a low-leakage excitation and demagnetization unidirectional or bidirectional energy conversion device for cryogenic coils, which cools some circuits containing large currents in the power electronic converter to a low temperature (the temperature can be the same as that of the cryogenic coil, or slightly higher, or slightly lower, or cryogenic coil system using a two-stage cryocooler or other heat sinks, can also be cooled to the temperature of the first stage of the cold head or other heat sinks), and some small-current circuits are preferably placed in relatively high temperatures. In this way, the overall total heat generation of the traditional current lead during excitation and energy feedback of the cryogenic coil is greatly reduced (the total heat generation mainly includes the conduction leakage heat on the current lead and the joule heat during the current flow).

Figure 4A:
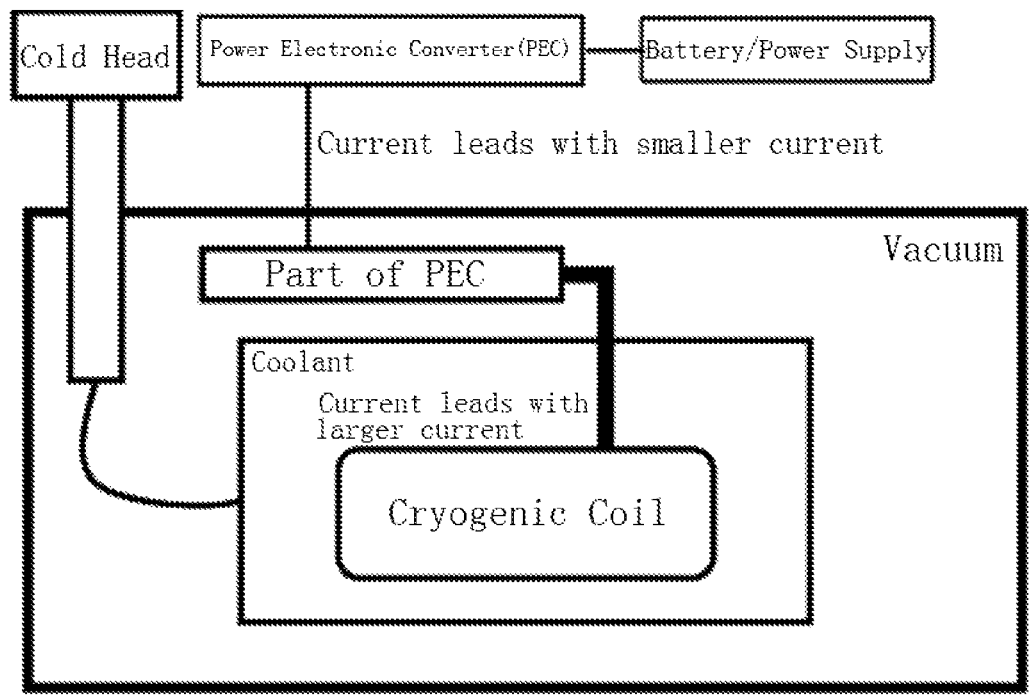
FIG. 4a is a schematic diagram of a preferred embodiment of the cryogenic coil excitation or demagnetization energy conversion device of the present invention.
Figure 4B:
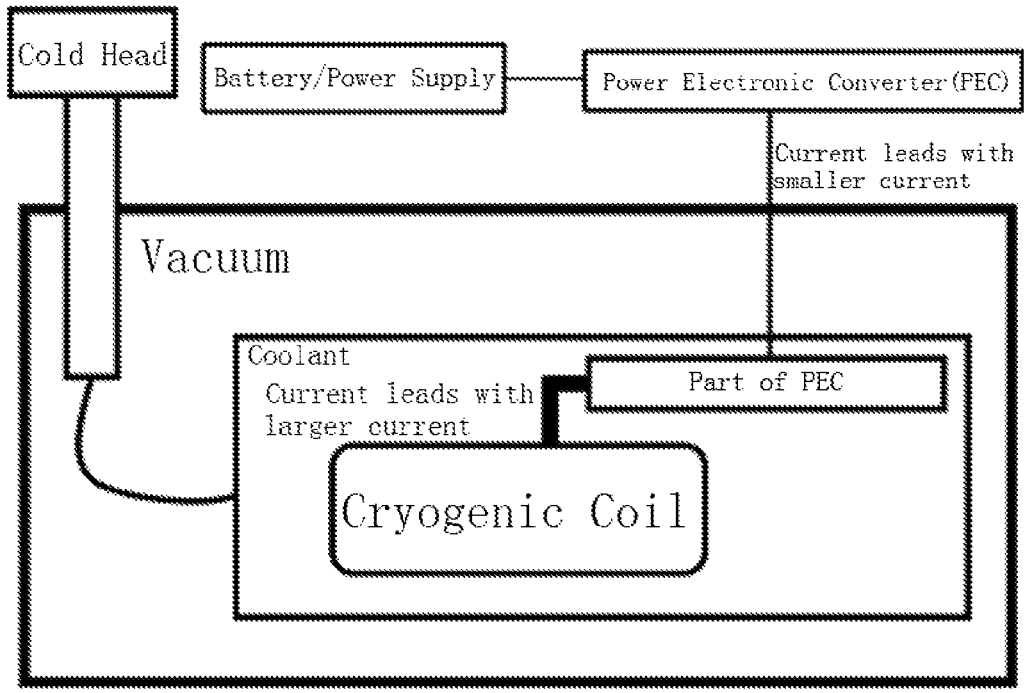
FIG. 4b is a schematic diagram of a preferred embodiment of the cryogenic coil excitation or demagnetization energy conversion device of the present invention.
Figure 4C:
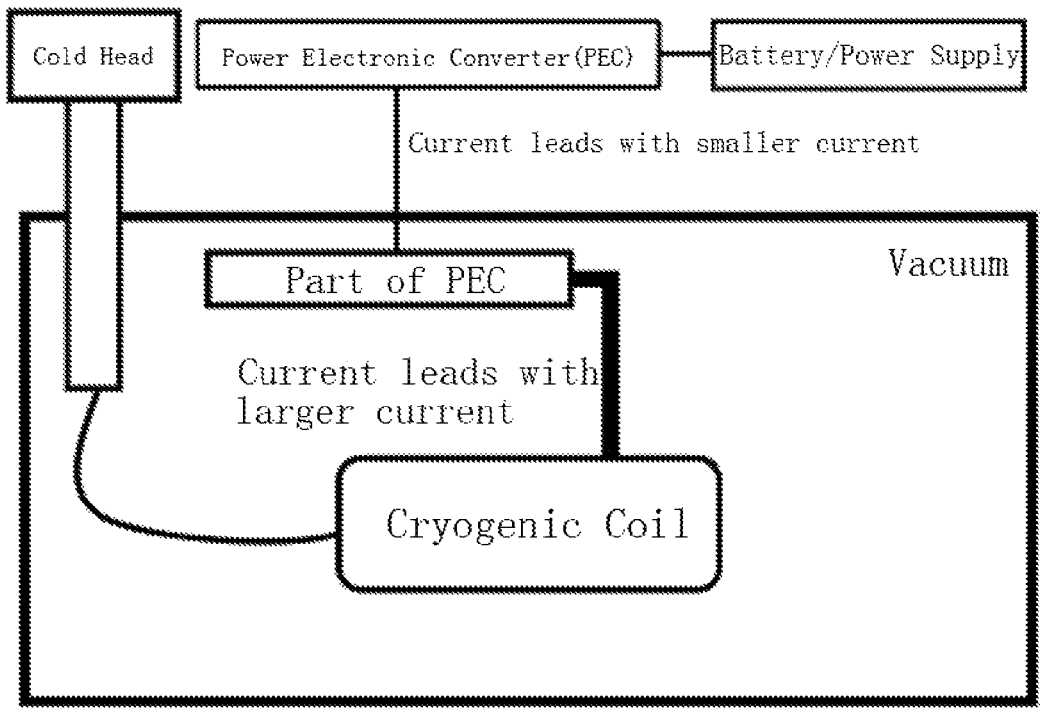
FIG. 4c is a schematic diagram of a preferred embodiment of the cryogenic coil excitation or demagnetization energy conversion device of the present invention.
Figure 4D:
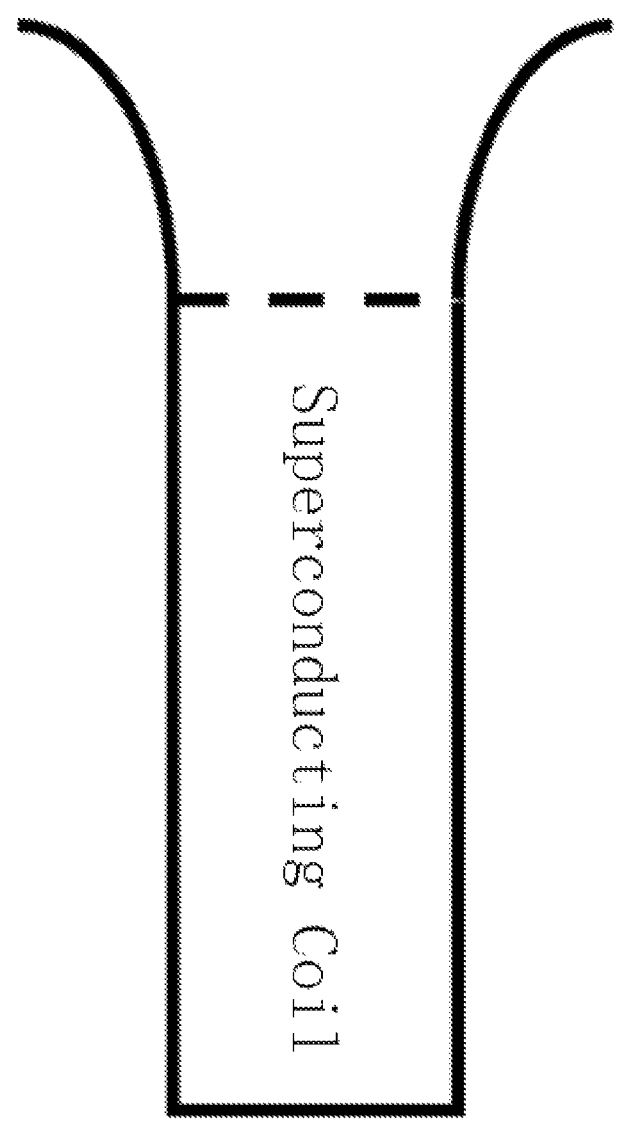
FIG. 4d is a schematic diagram of a preferred embodiment of the closed loop operation of the superconducting coil of the present invention.

As shown in FIG. 4(a)-(c), the cryogenic coil is preferably a superconducting coil. The cooling method of the cryogenic coil can be the cold source module, such as the cryocooler (cold head) as shown in FIG. 4(a)-(c), or the use of cold helium gas piping, or direct cooling by coolant. If the cryogenic coil is a superconducting coil, it can operate either in an open loop or in a closed loop. The working mechanism of closed-loop operation is shown in FIG. 4(d). When the superconducting coil is excited, the dashed part becomes resistive (the resistance source is quench of superconductor or the dynamic resistance of the flux pump), which is passed through the battery or power supply and the power electronic converter (including the low temperature part) starts the excitation. After the excitation is completed, the dashed part returns to almost or completely zero resistance. Finally, the battery or power supply or power electronic converter is turned off, and the current flows in the closed coil.

The closed-loop operation is similar to the prior art 2 superconducting coil closed-loop excitation technology, except that the traditional pluggable current lead is changed to a current lead with a power electronic converter (it can also be changed to a current lead with a power electronic converter. Choose to use the disconnectable/pluggable mode, the disconnection position can be at the larger-current current lead or at the lower-current current lead and/or the signal line, so as to further reduce the heat leakage during closed-loop operation). If it is other conductive coils with resistance (such as copper coils, etc.), open loop operation is preferred. Among the embodiments, the power electronic converter is preferably a DC-DC converter.

Figure 17:
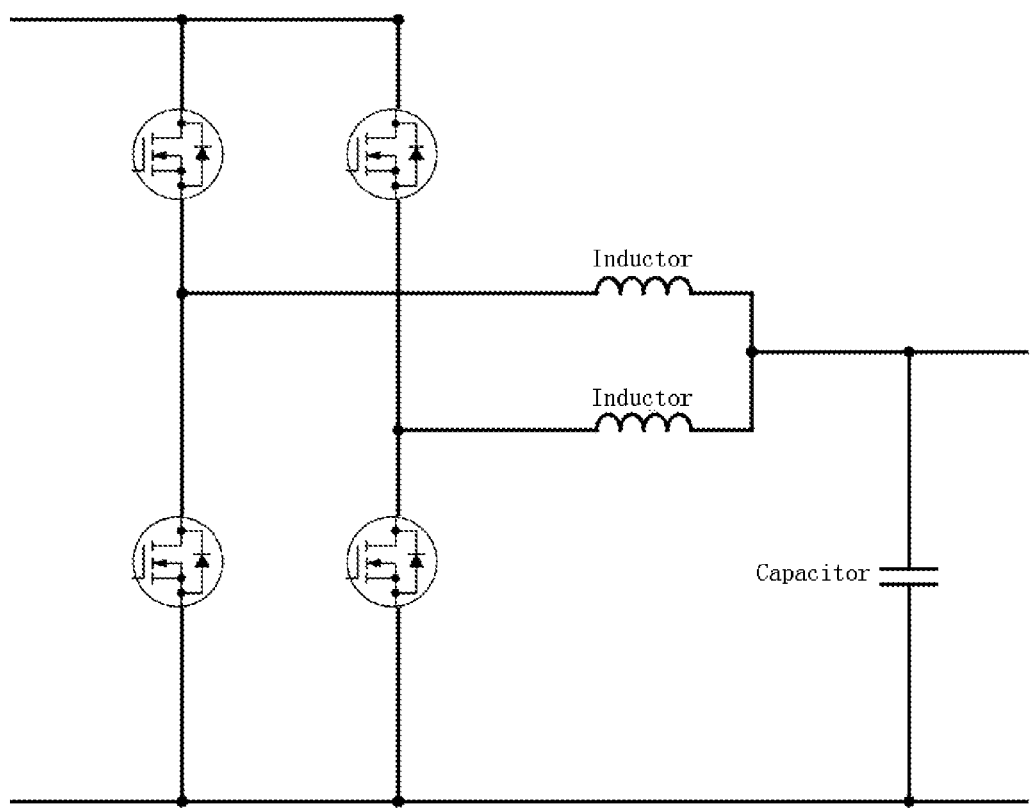
FIG. 17 is a schematic diagram of a topological structure of a DC-DC converter in interleaved parallel connection according to the present invention.

The DC-DC converter can be a single or multiple parallel circuit topology structure. For multiple parallel structures, it is preferable to adopt interleaved parallel technology. The interleaved parallel can adopt two-phase or multi-phase parallel, as shown in FIG. 17. Shown as a two-phase interleaved parallel, multi-phase interleaved parallel can be deduced by analogy. The interleaved parallel circuit can be used to replace the bidirectional Buck-Boost circuit in FIG. 5. Among the embodiments, the circuit devices that the input and output are small current and may not be suitable for working in low temperature environments (hereinafter referred to as relatively high temperature circuit part), such as digital controllers that control power electronic converters (such as DSP, FPGA, MCU, ARM based CPU, etc.), the driver of the fully-controlled power semiconductor device in the circuit is preferably placed in a relatively high temperature, such as room temperature or independently placed in a vacuum cooled by a cold head or a coolant module (such as a coolant container wall) or a dewar wall or cold helium gas pipe or cold shield or cryogenic coil for heat dissipation; but it can also be placed in a coolant module or vacuum module, at a temperature similar to or the same as the cryogenic coil or first stage of the cold head or other heat sinks.

The main circuit in the low temperature is a full-bridge circuit containing a large-current (corresponding to the partial circuits in the power electronic converter in FIG. 4(a)-(c)). The power semiconductor device in this circuit can be selected as a fully controlled power semiconductor device. The fully-controlled power semiconductor device is preferably a MOSFET, an IGBT, a wide band gap semiconductor (SiC/GaN), etc., and each full-bridge arm is preferably a plurality of fully-controlled power semiconductor devices in parallel. The topological structure of a single bidirectional DC-DC converter circuit composed of MOSFETs is shown in FIG. 5 or FIG. 6 (the part in the solid frame in FIG. 5 or FIG. 6 is the part placed in low-temperature environment).

Figure 5:
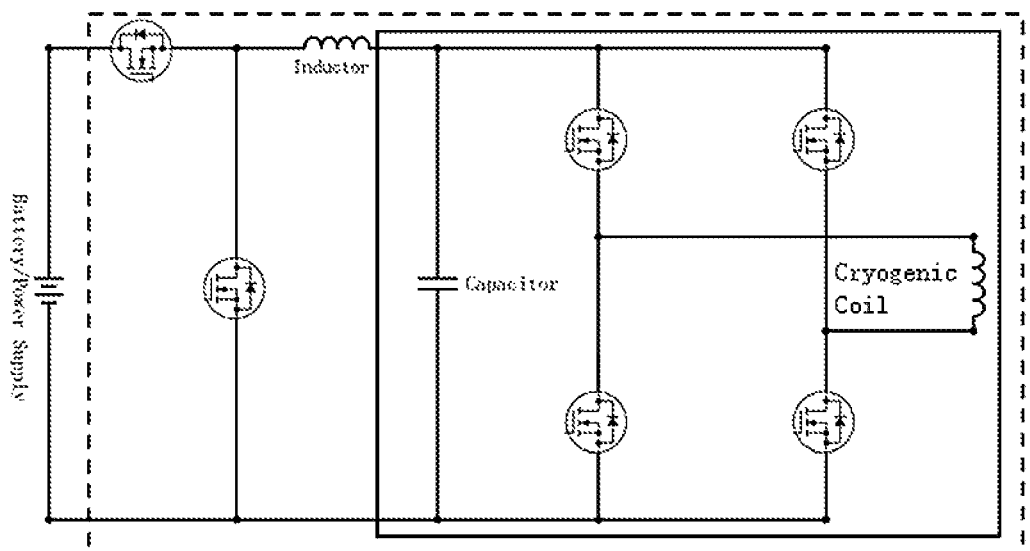
FIG. 5 is a schematic diagram of the topological structure of the bidirectional Buck-Boost and bridge circuit of the power electronic converter according to the present invention.
Figure 6:
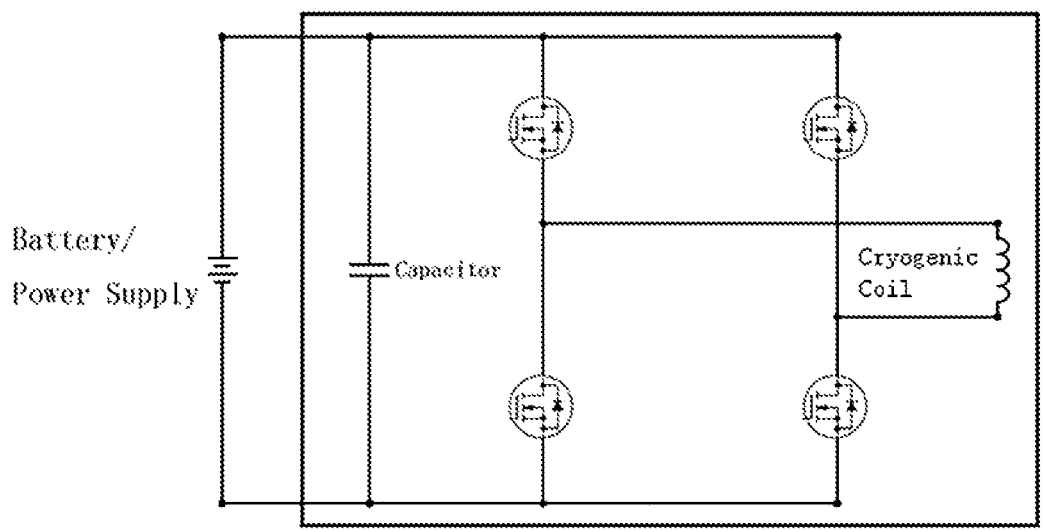
FIG. 6 is a schematic diagram of the circuit topology of the power electronic converter bridge DC converter according to the present invention.

The circuit in FIG. 5 consists of a bidirectional Buck-Boost circuit and a bridge DC converter, while the circuit in FIG. 6 consists of a bridge DC converter. The wires in the cryogenic circuit part and the relatively high-temperature circuit part that are vulnerable to interference in signal transmission are preferably connected by one or more pairs of twisted pairs.

In the present invention, a single or multiple superconducting materials can be selected for the larger-current current lead, so that the heat generation during excitation or energy feedback is almost zero. In order to prevent the possible temperature gradient on the superconducting current lead from reducing the critical current of the superconducting material (the higher the temperature, the lower the critical current of the superconducting material), the use of superconducting materials is preferably multilayer stacks or stranded wire or superconducting composite cables (such as CORC, etc.) to increase the current carrying capacity when superconducting is used as a large current lead to prevent quenching. The preferred number of layers or strands should be more than the single turn of the cryogenic coil. The number of layers or strands of the multi-layer stack structure is preferably connected and reinforced by soldering. This larger-current current lead can also be a good conductor material, or a mixed current lead of a good conductor material and a superconducting material (for example, one section is a good conductor material, one section is a superconducting material, or a good conductor material and a superconducting material stacked on top of each other). Good conductor materials such as copper, aluminum or silver leads. When these materials are at low temperature, their resistivity becomes smaller (at 20K, copper (RRR=50). The resistivity is about 0.02 times that of room temperature. The resistivity of aluminum is about 0.012 times that of room temperature, silver resistivity is about 0.004 times that of room temperature), and then by optimizing the length and cross-sectional area of the good conductor lead, the total heat generation of the good conductor material is further reduced, so the heat generation of the good conductor lead on the larger current end at low temperature is also very small. The relatively high-temperature end of the smaller-current can be controlled by the voltage input to the cryogenic power electronic converter, so that the current on the smaller-current end can become very small.

Figure 7A:
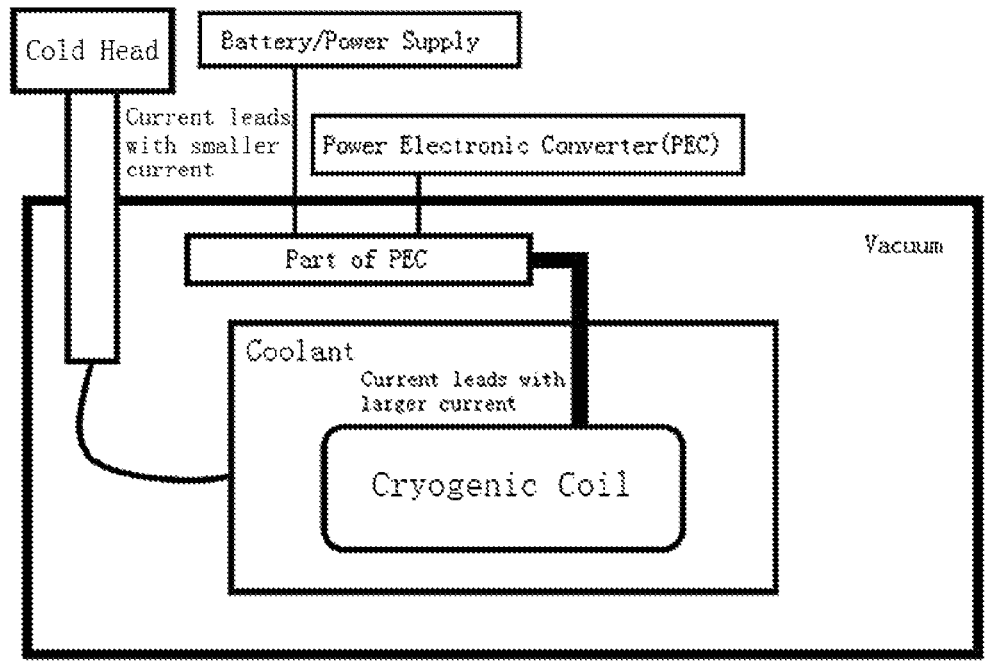
FIG. 7a is a schematic diagram of another preferred embodiment of the cryogenic coil excitation or demagnetization energy exchange device according to the present invention.
Figure 7B:
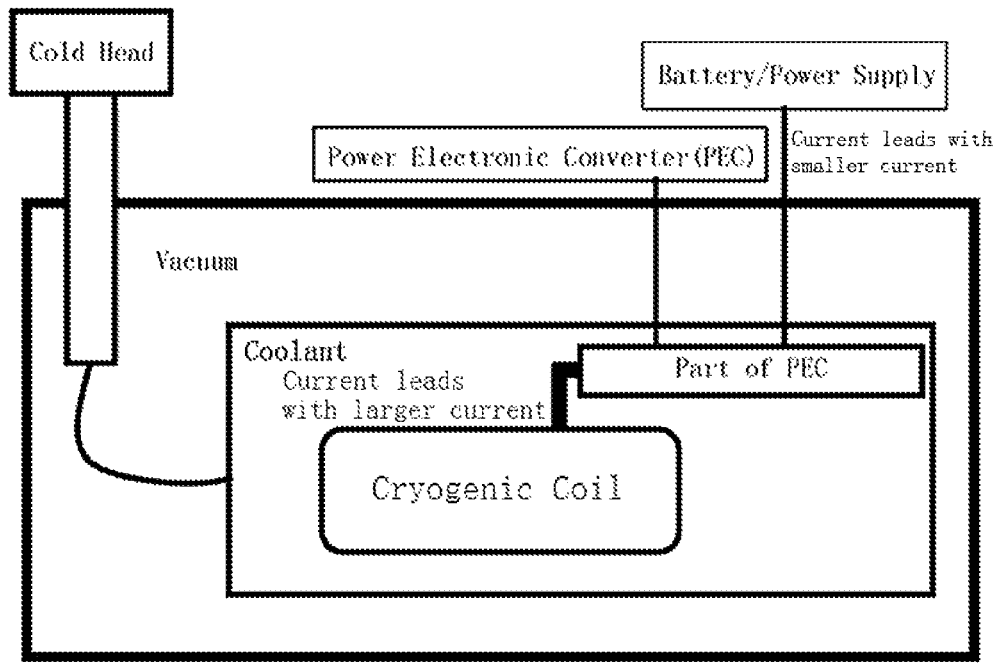
FIG. 7b is a schematic diagram of another preferred embodiment of the cryogenic coil excitation or demagnetization energy conversion device of the present invention.
Figure 7C:
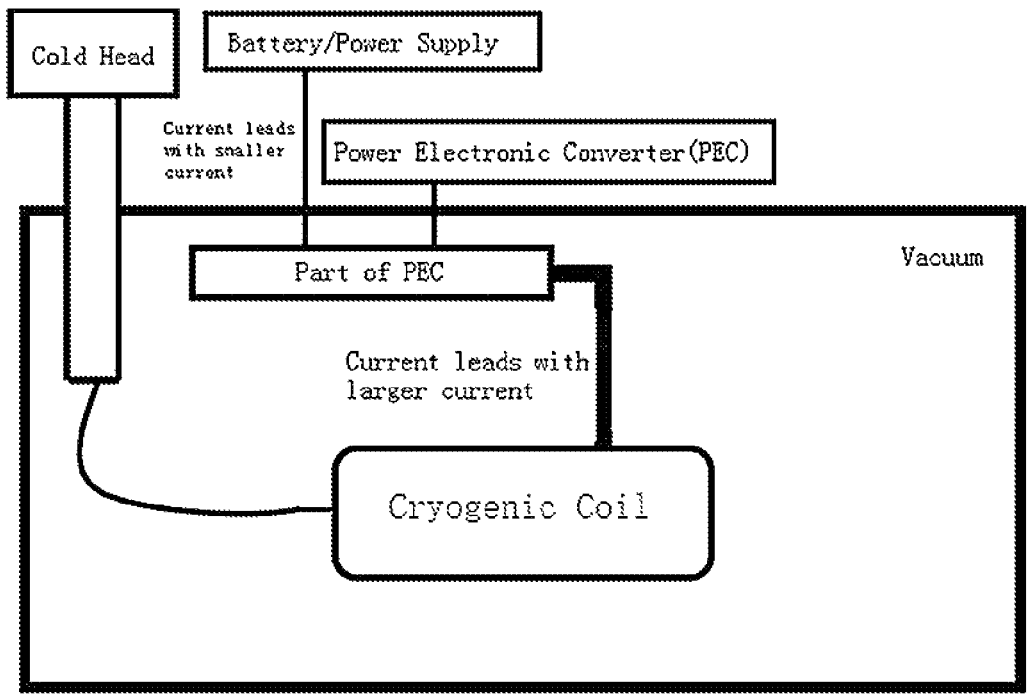
FIG. 7c is a schematic diagram of another preferred embodiment of the cryogenic coil excitation or demagnetization energy conversion device of the present invention.

Part of the circuit of the cryogenic power electronic converter as shown in the solid frame in FIG. 5 can be placed in a vacuum, and can be reduced to the required low temperature through the cold head or the wall of the coolant container or the cold helium pipe or the cold screen or the cryogenic coil, as shown in FIG. 4(b), it is placed in the coolant module (it can be reduced to the required low temperature by the coolant or the inner wall of the coolant container or the cryogenic coil). The coolant can choose from liquid nitrogen, solid nitrogen, liquid neon, solid neon, liquid hydrogen, liquid helium, cold helium, liquid oxygen, liquefied natural gas, etc. according to the different working temperature of the cryogenic coil. The scheme of FIG. 4(a)-(c) can also be changed to a scheme similar to FIG. 7(a)-(c). The difference is that the part of the circuit of the power electronic converter at low temperature can be replaced with the circuits as shown in the dashed lines in FIG. 5 (including more circuits such as full-controlled power semiconductor devices in the bidirectional Buck-Boost circuit and the inductance between the high and low voltage bus bars), the bidirectional Buck-Boost circuit in the dashed lines in FIG. 5 can also be replaced by a full bridge circuit.

Second Set of Embodiments

Figure 12:
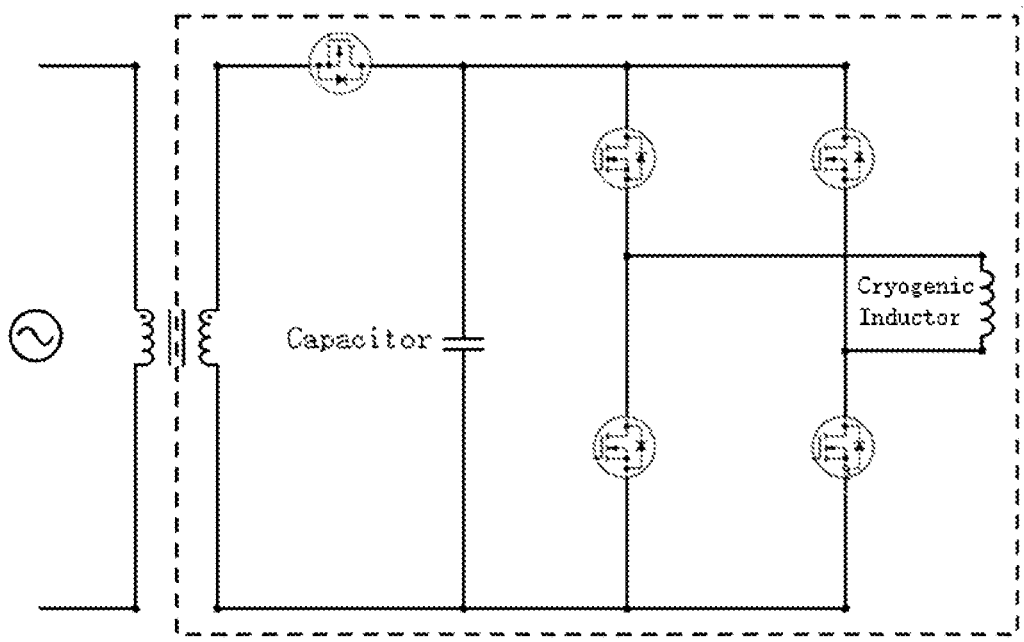
FIG. 12 is a schematic diagram of the half-wave fully controlled rectification AC-DC converter according to the present invention.
Figure 13:
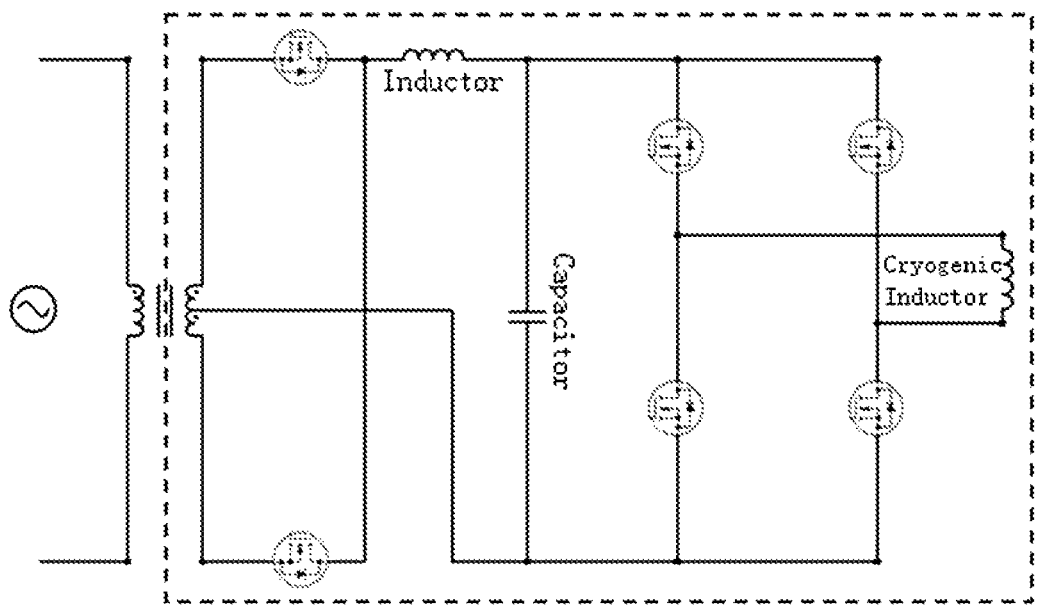
FIG. 13 is a schematic diagram of the full-wave and fully-controlled rectification AC-DC converter according to the present invention.
Figure 14:
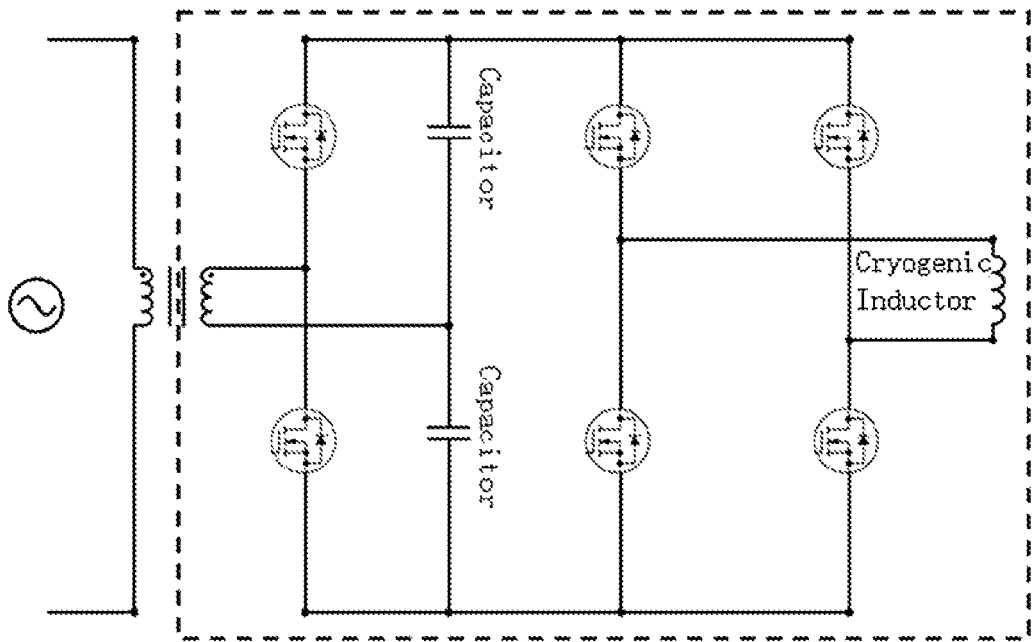
FIG. 14 is a schematic diagram of the single-phase half-bridge fully controlled rectification AC-DC converter according to the present invention.
Figure 15:
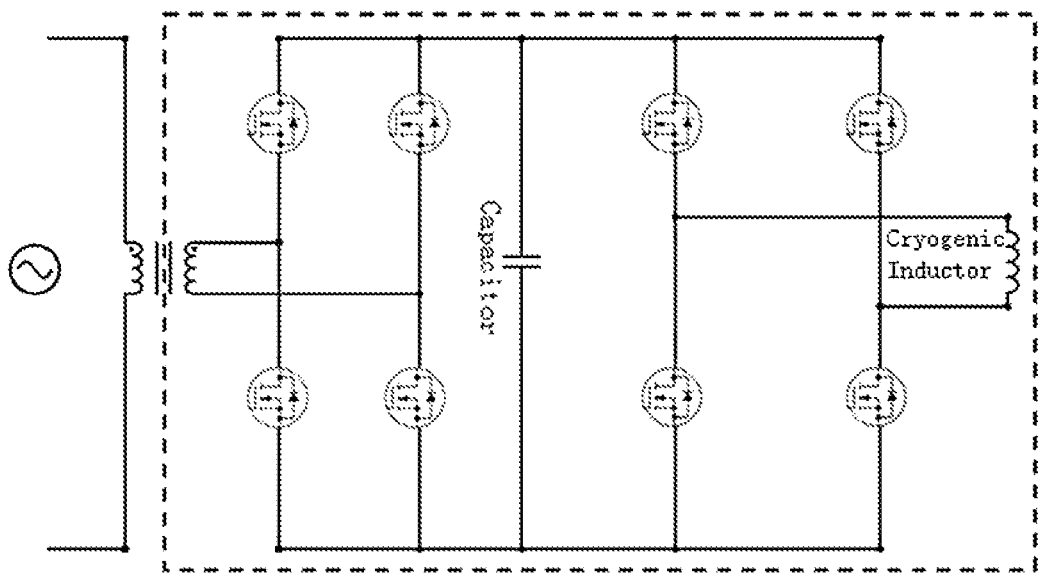
FIG. 15 is a schematic diagram of the single-phase full-bridge fully-controlled rectifier AC-DC converter according to the present invention.

As shown in FIG. 11, the power electronic converter can be selected as an AC-DC converter with a transformer, such as a half-wave fully-controlled rectifier circuit or a full-wave fully-controlled rectifier circuit or a single-phase half-bridge fully-controlled rectifier circuit or a single-phase full-controlled rectifier circuit. For the bridge full-control rectifier circuit, other parts of this embodiment (such as the location of the digital controller, twisted pair, high-current leads, full-control power semiconductor devices, etc.) are basically the same as the first group of embodiments. The schematic diagram of the half-wave fully-controlled rectifier circuit and the bridge DC converter is shown in FIG. 12, and the schematic diagram of the full-wave fully-controlled rectifier circuit and the bridge DC converter is shown in FIG. 13. The single-phase half-bridge fully-controlled rectifier circuit and the bridge DC The schematic diagram of the converter is shown in FIG. 14, and the schematic diagram of the single-phase full-bridge fully-controlled rectifier circuit and the bridge DC converter is shown in FIG. 15. The input end of the transformer in FIG. 12, FIG. 13, FIG. 14, and FIG. 15 is preferably an inverter or an AC power supply. If necessary to separate the primary side circuit and the secondary side circuit of the transformer by vacuum, a loosely coupled transformer is preferred. Part of the circuit 1 in the power electronic converter with transformer (as shown in FIG. 11(a)-(d), and the corresponding circuit topology diagram is shown in FIG. 12 or FIG. 13 or FIG. 14 or FIG. 15 in the dashed frame). To the same or close to the temperature of the cryogenic coil (for example, the cryogenic coil system uses a two-stage cryocooler or has other heat sinks, it can also be cooled to near the temperature of the first stage of the cold head or other heat sinks), and the power transmission is carried out by means of transformer coupling. Part of the circuit 2 in the power electronic converter with transformer (as shown in FIGS. 11(a), (b) and (d)) and the power electronic converter with transformer (as shown in FIG. 11(c)) contain the primary part of the loosely coupled transformer. The relative placement of power electronic converters with loosely coupled transformers and cryogenic containers are shown in FIG. 11(a)-(d). In a circuit that is in a vacuum and does not contact with a large-current lead, the heat can be taken away by selecting a cold head or a coolant container wall or a dewar wall or a cold helium pipe or a cold shield or a cryogenic coil connection. It should be noted that if there is a container wall between the primary and secondary sides of the loosely coupled transformer (as shown in FIG. 11(a), (c)), this part of the container wall is preferably non-metallic and/or non-ferromagnetic material.

If it is a tightly coupled transformer, the half-wave fully controlled rectifier circuit and bridge DC converter shown in FIG. 12 can be cooled to a low temperature or the bridge DC converter can be cooled to a low temperature or circuits other than the transformer can be cooled to a low temperature; The full-wave fully-controlled rectifier circuit and the bridge DC converter shown in 13 can be cooled to low temperature or the bridge DC converter can be cooled to low temperature or circuits other than transformers can be cooled to low temperature; the single-phase half-bridge full-bridge shown in FIG. 14. The controlled rectifier circuit and the bridge DC converter can be cooled to a low temperature or the bridge DC converter can be cooled to a low temperature or the circuit other than a transformer can be cooled to a low temperature; the single-phase full bridge fully controlled rectifier circuit and the bridge DC converter as shown in FIG. 15. The converter can be cooled to a low temperature or a bridge DC converter can be cooled to a low temperature or a circuit other than a transformer can be cooled to a low temperature. When the bridge DC converter is cooled to low temperature in the above four cases, the half-wave fully-controlled rectifier circuit in FIG. 12, the full-wave fully-controlled rectifier circuit in FIG. 13, and the single-phase half-bridge fully-controlled rectifier circuit in FIG. 14, The fully-controlled power semiconductor devices in the single-phase full-bridge fully-controlled rectifier circuit in FIG. 15 can be replaced by diodes and/or semi-controlled power semiconductor devices. The low temperature here is defined as the same or close to the temperature of the low temperature coil (for example, the low temperature coil system uses a two-stage cryocooler or has other heat sinks, and it can also be cooled to near the temperature of the first stage of the cold head or other heat sinks) The location of the cryogenic circuit is shown in FIG. 4(a)-(c) as part of the circuit in the power electronic converter.

Figure 8A:
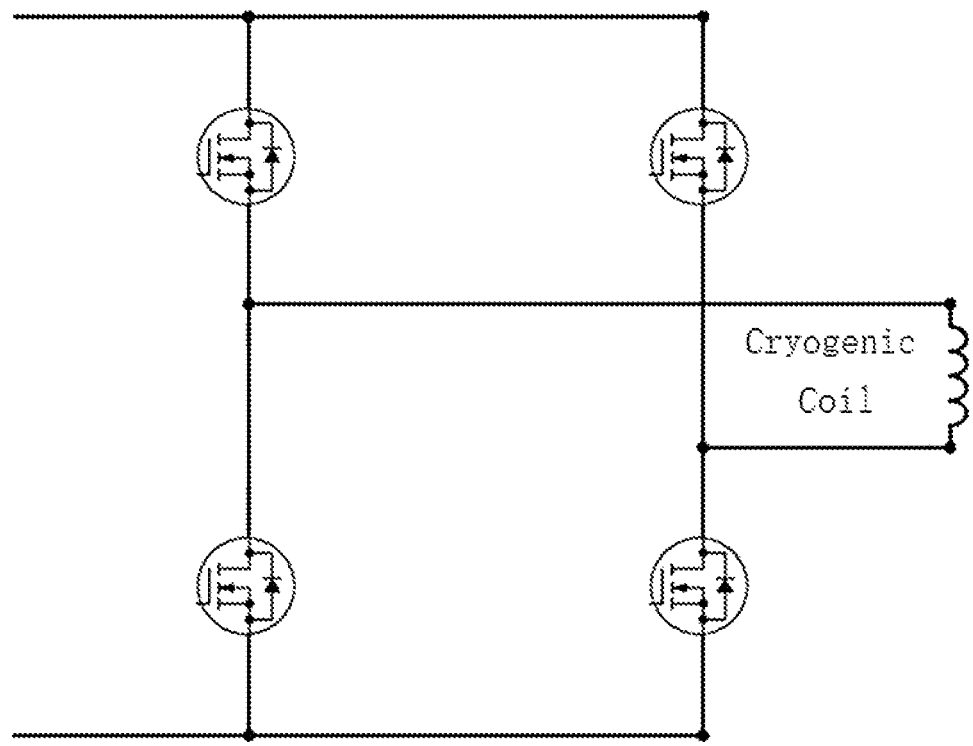
FIG. 8a is a schematic diagram of an energy conversion device based on a full-bridge circuit according to the present invention.
Figure 8B:
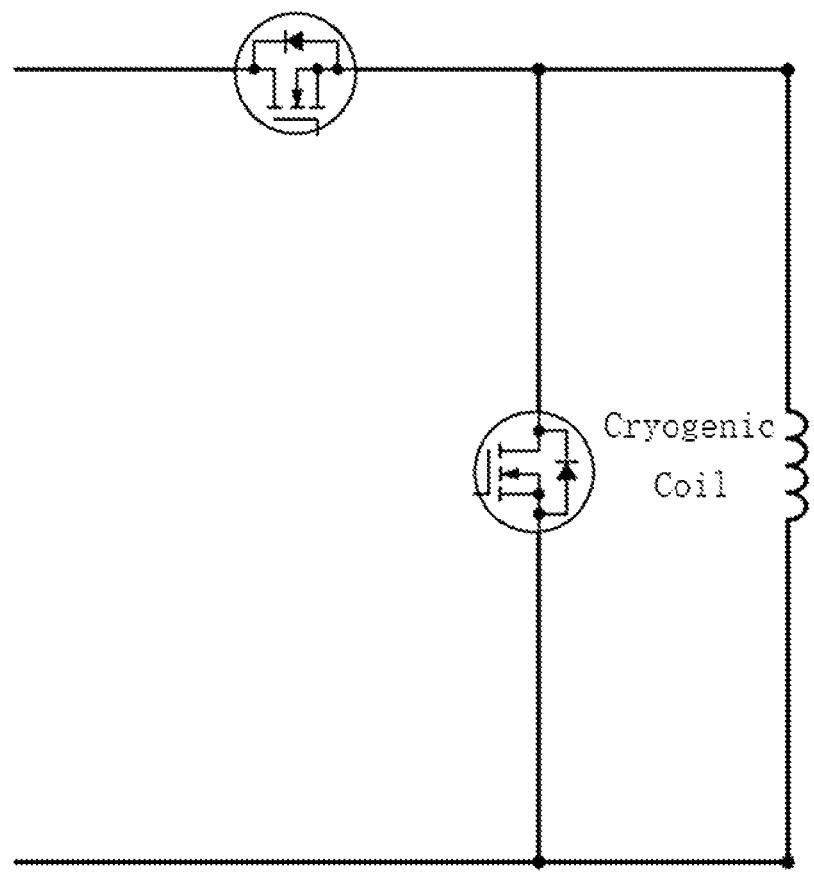
FIG. 8b is a schematic diagram of another energy conversion device based on a half-bridge circuit according to the present invention.
Figure 9:
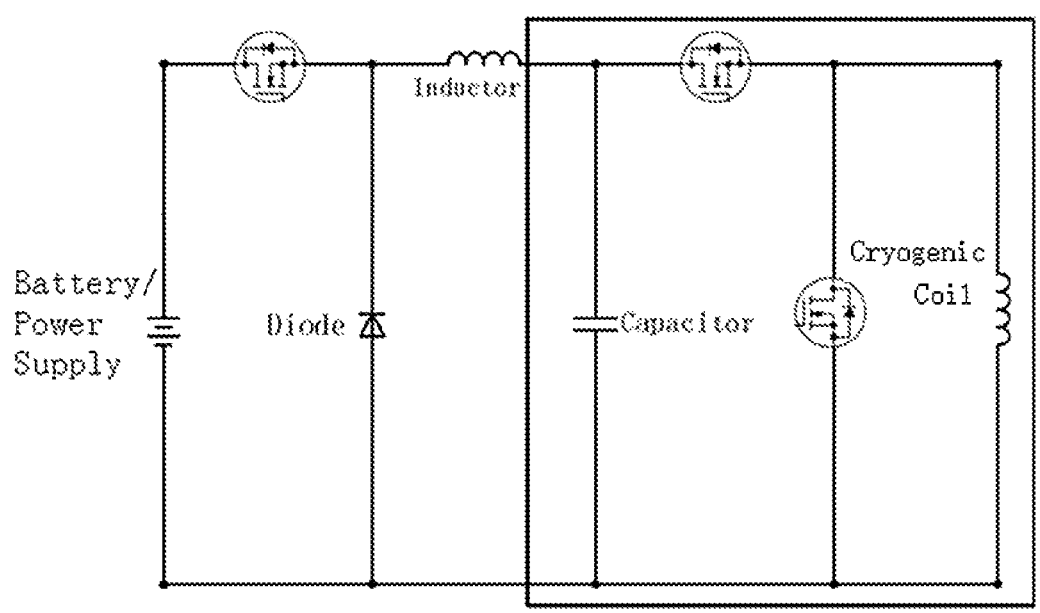
FIG. 9 is a schematic diagram of a preferred embodiment of the cryogenic coil unidirectional excitation device of the present invention.

In other embodiments of this group, the bridge DC converter parts in FIG. 5, FIG. 6, FIG. 10, FIG. 12, FIG. 13, FIG. 14, FIG. 15 can be made of the full bridge circuit form of FIG. 8(a) simplified to the half-bridge circuit form of FIG. 8(b); and FIG. 9 (the part in the solid frame is the part placed in a low temperature environment), which replaces the bidirectional Buck-Boost circuit of FIG. 5 with a Buck circuit. The preferred bridge DC converter can be replaced by a half-bridge circuit. The battery and/or power supply in FIG. 5, FIG. 6, FIG. 9, and FIG. 10 may also include other energy storage devices such as capacitors and inductors and/or rectifiers and/or isolation transformers.

Figure 10:
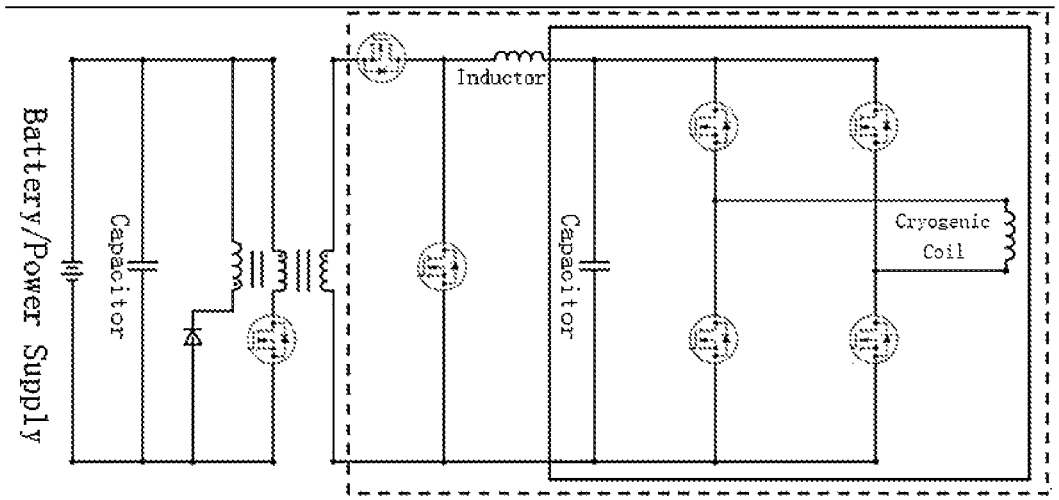
FIG. 10 is a schematic diagram of the circuit topology structure of the bidirectional forward converter and the bridge DC converter according to the present invention.
Figure 11A:
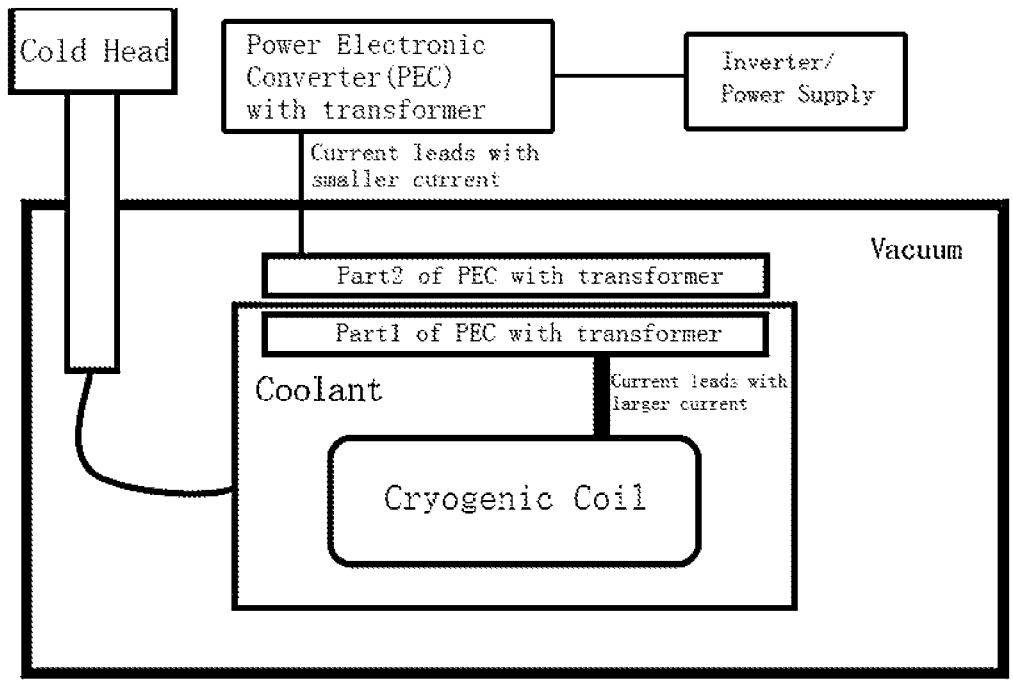
FIG. 11a is a schematic diagram of another preferred embodiment of the cryogenic coil excitation or demagnetization energy conversion device of the present invention.
Figure 11B:
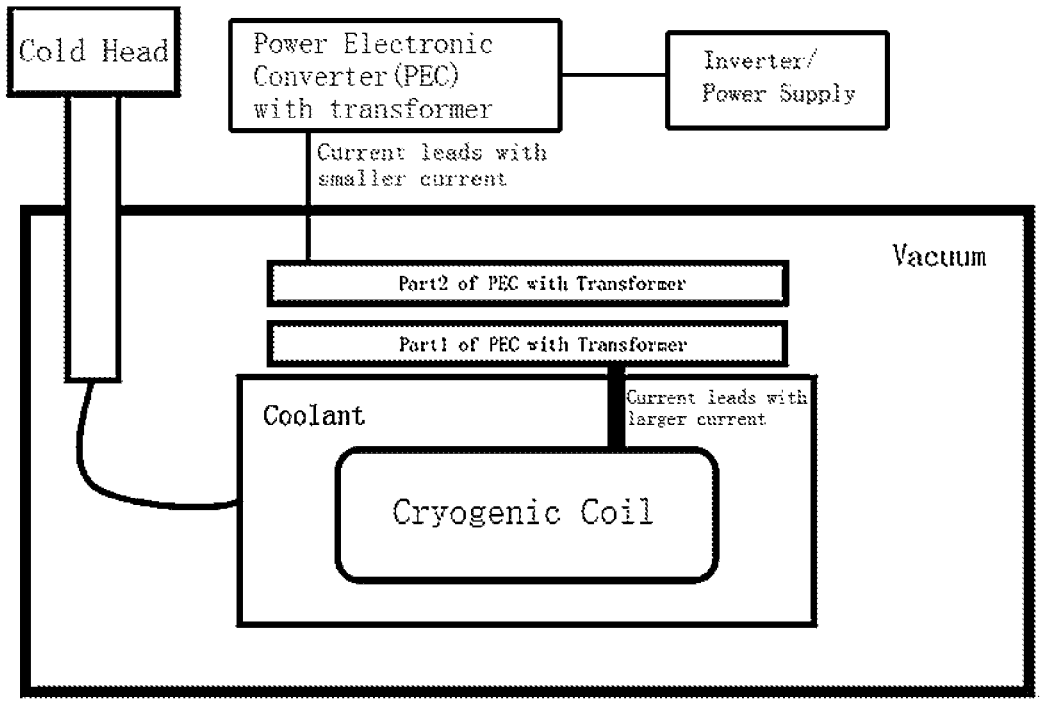
FIG. 11b is a schematic diagram of another preferred embodiment of the cryogenic coil excitation or demagnetization energy conversion device of the present invention.
Figure 11C:
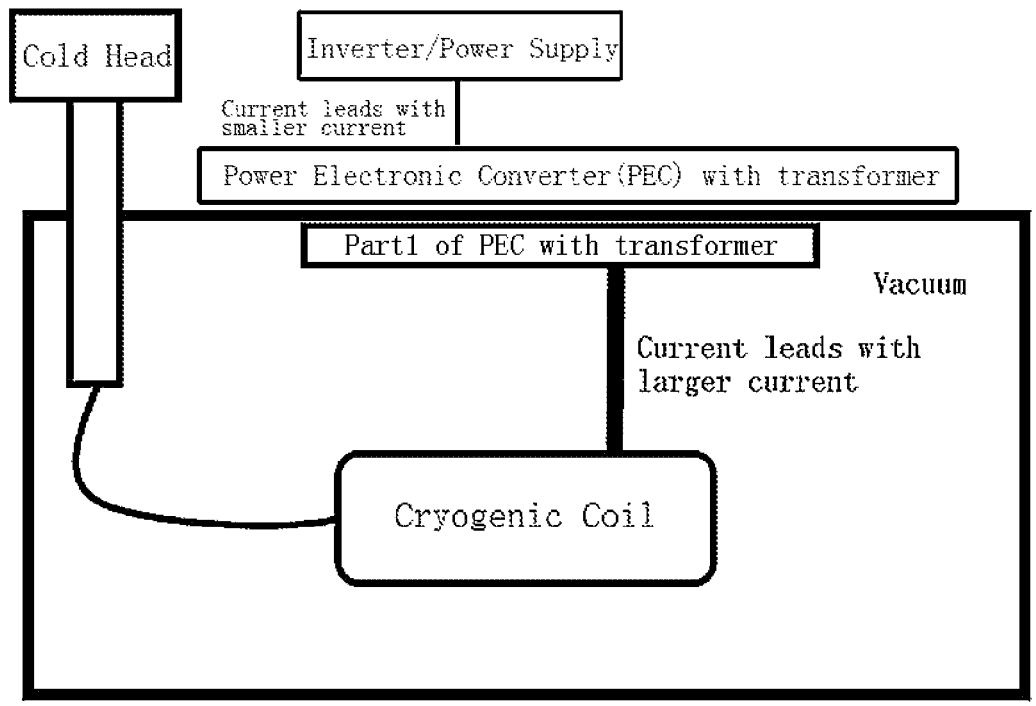
FIG. 11c is a schematic diagram of another preferred embodiment of the cryogenic coil excitation or demagnetization energy conversion device of the present invention.
Figure 11D:
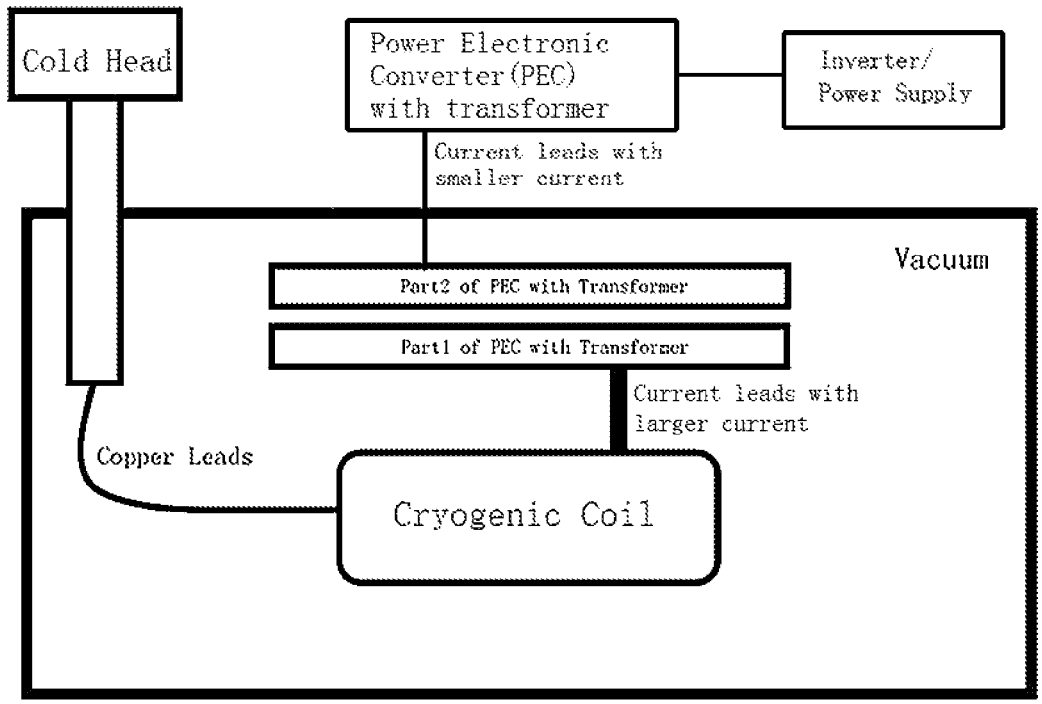
FIG. 11d is a schematic diagram of another preferred embodiment of the cryogenic coil excitation or demagnetization energy conversion device of the present invention.

Circuits with isolation transformers include flyback, forward, push-free, half-bridge, full-bridge, etc., such as the topology of the bidirectional forward converter and bridge DC converter. The schematic diagram is shown in FIG. 10. The positional relationship between the forward converter and the bridge DC converter in this circuit is shown in FIG. 4(a)-(c). The power electronic converter part of the circuit in the figure can include FIG. 10 shows the part shown in the solid line frame (full bridge) or the part shown in the dashed frame (the secondary side of the bidirectional forward converter circuit, but does not include the transformer winding).

In the above-mentioned embodiments, the cryogenic coil and the part of the circuit in the power electronic converter of FIG. 4, FIG. 7, and FIG. 11 or the part of the circuit 1 in the power electronic converter with transformer can be selected at the larger-current current lead. And/or the superconducting closed coil is closed (as shown in the dashed line in FIG. 4(d)) with a cryogenic inductor to control the ripple fluctuation of the excitation and/or demagnetization current. The low-temperature inductor is preferably a superconducting coil.

In the above-mentioned embodiments of the present invention, the energy conversion device with a cryogenic coil of the present invention further includes an energy release protection module. The energy release protection module may be composed of a pair of diodes and/or resistors connected in parallel to the internal energy module's both ends (cryogenic coil and/or superconducting coil), for the purpose of releasing energy, protecting the cryogenic coil and/or persistent current switch, etc.

Figure 16:
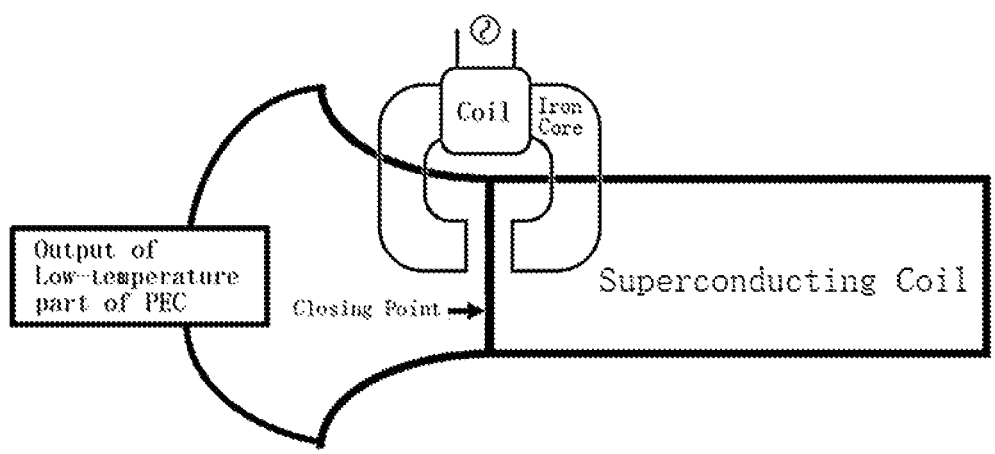
FIG. 16 is a schematic diagram of a magnetic flux pump composed of a cryogenic power electronic converter and an AC iron core coil according to the present invention.

In another embodiment of the present invention, as shown in FIG. 16, the cryogenic power electronic converter can output direct current and interact with the external alternating magnetic field provided by the electromagnet with the iron core to generate dynamic resistance at the closed position of the superconducting coil, for magnetic control excitation (flux pump), compared with the existing low-frequency rectifier type of magnetic flux pump, the weight is lighter, the energy is pumped faster, and the control is simpler. Compared with the prior art, the advantages and beneficial effects of the energy conversion device with cryogenic coils of the present invention mainly include:

(1) Compared with the prior art 1 cryogenic coil open-loop excitation technology, if the cryogenic coil operates in an open loop, the heat generated on the current lead during excitation of the present invention is greatly reduced, so the required power of cooling is reduced, and the overall weight of the cryogenic coil system is reduced. The present invention solves the problem of large heat leakage on the current lead, so that the original superconducting coil can only be operated in closed loop, and open loop operation can be selected. The open loop operation can allow coils winding by high temperature superconducting materials (such as REBCO, etc.) Easier to quickly release energy. At the same time, compared with the prior art 2 and prior art 3 superconducting coil closed-loop excitation technology, the dependence on ultra-low resistance or superconducting joints is avoided. The open-loop operation of the superconducting coil can obtain a higher operating current than the closed-loop operation, which means that the superconducting coil needs less superconducting material to produce the same magnetic induction intensity under the same circumstances, which reduces the material cost of the coil system or in the same amount of superconducting material, increase the operating temperature, so that the superconducting coil system can obtain more cooling power.

(2) Compared with the prior art 1, cryogenic coil open-loop excitation technology and prior art 2 superconducting coil closed-loop excitation technology, the present invention has low heating power on the current lead when the coil is excited. The current lead with the power electronic converter can avoid or reduce the thermal power generated by the interface contact thermal resistance at the connection, so that the superconducting coil can obtain a lower temperature under the same excitation condition, thereby obtaining a larger current safety margin or higher excitation current.

(3) Compared with the prior art 2 superconducting coil closed loop excitation technology, if the superconducting coil operates in a closed loop, the present invention can reduce the total heat generation on the current lead when the thermal control superconducting persistent current switch is excited. The superconducting persistent current switch can be changed from a thermal control switch to a current control switch, which greatly simplifies the internal structure of the closed coil and eliminates some external supporting equipment (such as temperature controllers, etc.). Or it can be used with thermal control and current control switch to reduce the risk of heat island formation at the switch.

(4) Compared with the prior art 3 superconducting coil closed-loop excitation technology, the power electronic converter in the present invention can output direct current and interact with the external alternating magnetic field provided by an electromagnet with an iron core to generate dynamic resistance at the closed coil. Magnetically controlled excitation (flux pump) is lighter in weight, faster in energy pumping, and simpler in control than low-frequency rectifier-type magnetic flux pumps.

(5) Compared with the prior art 3 superconducting coil closed-loop excitation technology, the power electronic converter of the present invention can achieve faster excitation speed and/or more convenient energy feedback to the superconducting coil.

(6) Compared with the prior art 2 and 3, the present invention can be used for open-loop operation of cryogenic coils. In this case, it is not limited to superconducting coils, but is also applicable to other good-conductor cryogenic coils.

In summary, the cryogenic coil energy feeding single or two-way conversion device of the present invention has strong robustness; less heat leakage; either fast or slow charging and discharging; high power density; convenient energy feedback and the power of the cooling system can be much smaller, such as cold head and the compressor, the weight of the cryogenic coil system is greatly reduced.

The preferred embodiments of the present invention have been described in detail above. It should be understood that ordinary technician in the field can make many modifications and changes according to the concept of the present invention without creative work. Therefore, all technical solutions that can be obtained by those skilled in the art through logical analysis, reasoning or limited experiments based on the concept of the present invention on the basis of the prior art should fall within the protection scope determined by the claims.

The invention claimed is:

1. An energy conversion device with a cryogenic coil, comprises a cold source module, a vacuum module, an external energy module, an internal energy module, and a connection module; wherein the cold source module is configured to provide a cold source to the vacuum module, the external energy module is configured to be located outside the vacuum module, the internal energy module is configured to be located inside the vacuum module, and the internal energy module and the external energy module are configured to be connected through the connection module, and wherein the connection module comprises a power electronic converter, and the power electronic converter comprises a large-current unit and a small-current unit, and the large-current unit is connected to the internal energy module through a large-current current lead.

2. The energy conversion device according to claim 1, wherein the energy conversion device with a cryogenic coil further comprises a coolant module, the coolant module is configured to be located inside the vacuum module, and the internal energy module is configured to be located inside the coolant module.

3. The energy conversion device according to claim 1, wherein the large-current unit is configured inside the vacuum module.

4. The energy conversion device according to claim 1, wherein the large-current unit is configured inside the coolant module.

5. The energy conversion device according to claim 1, wherein the internal energy module is a cryogenic coil and/or a superconducting coil.

6. The energy conversion device according to claim 3, wherein the current lead connecting the large-current unit and the internal energy module is disconnectable.

7. The energy conversion device according to claim 3, wherein the current lead and/or signal wire connecting the small-current unit and the large-current unit are disconnectable, and/or the current lead connecting the external energy module and the large-current unit is disconnectable.

8. The energy conversion device according to claim 1, wherein the power electronic converter is a DC-DC converter or an AC-DC converter, and the DC-DC converter is single or multiple in a parallel topology, the AC-DC converter is a half-wave fully-controlled rectifier circuit or a full-wave fully-controlled rectifier circuit or a single-phase half-bridge fully-controlled rectifier circuit or a single-phase full-bridge fully-controlled rectifier circuit.

9. The energy conversion device according to claim 8, wherein the AC-DC converter is configured with a tightly coupled transformer or a loosely coupled transformer.

10. The energy conversion device according to claim 8, wherein the fully controlled power semiconductor device is replaced with diode and/or semi-controlled power semiconductor devices in the half-wave full-controlled rectification circuit or full-wave full-controlled rectification circuit or single-phase half-bridge full-controlled rectification circuit or single-phase full-bridge full-controlled rectification circuit.

11. The energy conversion device according to claim 1, wherein the large-current unit and the small-current unit are configured to be connected by at least one pair of twisted pairs.

12. The energy conversion device according to claim 1, wherein the large-current current lead is single wire or multiple wires made of superconducting materials.

13. The energy conversion device according to claim 1, wherein the larger current lead is a single wire or multiple wires made of good conductor materials or superconducting materials and/or their combinations.

14. The energy conversion device according to claim 1, wherein the power electronic converter comprises one or combination of Buck circuit, bidirectional Buck-Boost circuit, half-bridge circuit, bridge DC conversion circuit.

15. The energy conversion device according to claim 1, wherein the power electronic converter comprises a bridge-type DC conversion circuit, and further comprises a secondary side part of the bidirectional forward converter except for the winding of the transformer.

16. The energy conversion device according to claim 1, wherein the small-current unit comprises a digital controller and/or a driving circuit of a fully-controlled power semiconductor device, and the small-current unit is configured to be located outside of the vacuum module.

17. The energy conversion device according to claim 1, wherein the small-current unit comprises a digital controller and/or a driving circuit of a fully-controlled power semiconductor device, and the small-current unit is configured to be located inside of the vacuum module, the small-current unit is configured to be at a higher temperature than the large-current unit, cooling by the cold source module or the coolant module or the dewar wall or cold helium gas pipe or cold shield or cryogenic coil.

18. The energy conversion device according to claim 1, wherein the smaller current unit comprises a digital controller and/or a drive circuit of a fully-controlled power semiconductor device, the smaller current unit is configured to be located inside the coolant module or the vacuum module, at a temperature similar to or at the same temperature as the cryogenic coil or heat sink.

* * * * *